(12) United States Patent
Ameen Beshari et al.

(10) Patent No.: US 12,394,497 B2
(45) Date of Patent: Aug. 19, 2025

(54) EFFICIENT BITLINE STABILIZATION FOR PROGRAM INHIBIT IN NAND ARRAYS

(71) Applicant: Intel NDTM US LLC, Santa Clara, CA (US)

(72) Inventors: Tarek Ahmed Ameen Beshari, San Jose, CA (US); Shantanu R. Rajwade, San Mateo, CA (US); Ahsanur Rahman, Folsom, CA (US); Sagar Upadhyay, Folsom, CA (US); Pratyush Chandrapati, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 0 days.

(21) Appl. No.: 18/395,541

(22) Filed: Dec. 23, 2023

(65) Prior Publication Data

US 2024/0136003 A1    Apr. 25, 2024

(51) Int. Cl.
| | |
|---|---|
| *G06F 12/00* | (2006.01) |
| *G11C 16/04* | (2006.01) |
| *G11C 16/24* | (2006.01) |
| *G11C 16/34* | (2006.01) |

(52) U.S. Cl.
CPC ...... *G11C 16/3459* (2013.01); *G11C 16/0483* (2013.01); *G11C 16/24* (2013.01)

(58) Field of Classification Search
CPC . G11C 16/3459; G11C 16/0483; G11C 16/24; G11C 16/10

USPC .......................................................... 711/103
See application file for complete search history.

(56) References Cited

U.S. PATENT DOCUMENTS

| | | | |
|---|---|---|---|
| 7,996,811 B2* | 8/2011 | Hoberman | H03K 3/012 716/132 |
| 2001/0050860 A1* | 12/2001 | Kato | G11C 16/08 365/185.11 |
| 2012/0257469 A1 | 10/2012 | Campbell et al. | |
| 2012/0314507 A1 | 12/2012 | Sakui | |
| 2013/0047007 A1 | 2/2013 | Gunther et al. | |
| 2014/0056081 A1 | 2/2014 | Yoo et al. | |
| 2018/0059757 A1 | 3/2018 | Ananthakrishnan et al. | |

FOREIGN PATENT DOCUMENTS

JP    3945881 B2 *  7/2007  ......... G11C 16/0483

OTHER PUBLICATIONS

International Search Report and Written Opinion for PCT Patent Application No. PCT/US24/52663, Mailed Feb. 5, 2025, 11 pages.

* cited by examiner

*Primary Examiner* — Mardochee Chery
(74) *Attorney, Agent, or Firm* — Morgan, Lewis & Bockius LLP

(57) ABSTRACT

A storage device charges bitlines in preparation for a program pulse. To charge the bitlines, the storage device connects the bitlines to an external regulator instead of an internal regulator to prepare them for the program pulse. The system can charge all bitlines to the external regulator high voltage reference before changing to the internal regulator for bitline stabilization before the program pulse.

18 Claims, 10 Drawing Sheets

EFFICIENT BITLINE STABILIZATION FOR PROGRAM INHIBIT IN NAND ARRAYS

TECHNICAL FIELD

Descriptions are generally related to storage devices, and more particular descriptions are related to program operation for storage media.

BACKGROUND OF THE INVENTION

Nonvolatile memory such as NAND flash memory is commonly used in storage devices. When programming the NAND cells, bitlines selected for programming are typically driven to a low voltage, while bitlines not selected for programming are set to an inhibit voltage. There will be more bitlines set to the inhibit voltage, and the inhibit voltage is a relatively high voltage. When NAND cells are programmed, they block the current and the voltage is easy to maintain. Cells that are not programmed allow current to flow.

With potentially thousands or tens of thousands of bitlines, any of which can have a cell that is programmed, driving the bitlines to the inhibit voltage can cause a significant current spike. If too much current flows, the voltage of the internal regulator circuit can drop, which would cause many risks in the logic circuits of the NAND. The internal regulator circuit refers to the regulator that manages the program operation, and more specific to this discussion, is the power source to drive the bitlines to the inhibit voltage.

One approach to providing protection against the voltage droop is to add current limiting circuitry. However, it will be understood that the current limiting circuitry would consume significant circuit area and add a performance penalty by increasing the time to charge the bitlines. Another approach that can save the die area by not needing the current limiting circuitry has a more significant performance penalty by gradually increasing the voltage over multiple steps to avoid exceeding current limits. Such an approach is typically a staircase increase of voltage, which is slow, adding a significant time penalty to the bitline stabilization phase of the programming. Additionally, the staircase approach increases the complexity of the programming algorithm.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION OF THE INVENTION

As described herein, when a storage device charges bitlines in preparation for a program pulse, it can connect them to an external regulator instead of the internal regulator normally used for program operation. The system can charge all bitlines to the external regulator high voltage reference before changing to the internal regulator for bitline stabilization before the program pulse. When a storage device prepares the bitlines for program, it eventually brings the source high. In one example, with the external regulator, the system can drive the source high for the entire period of bitline preparation.

Figure 1:
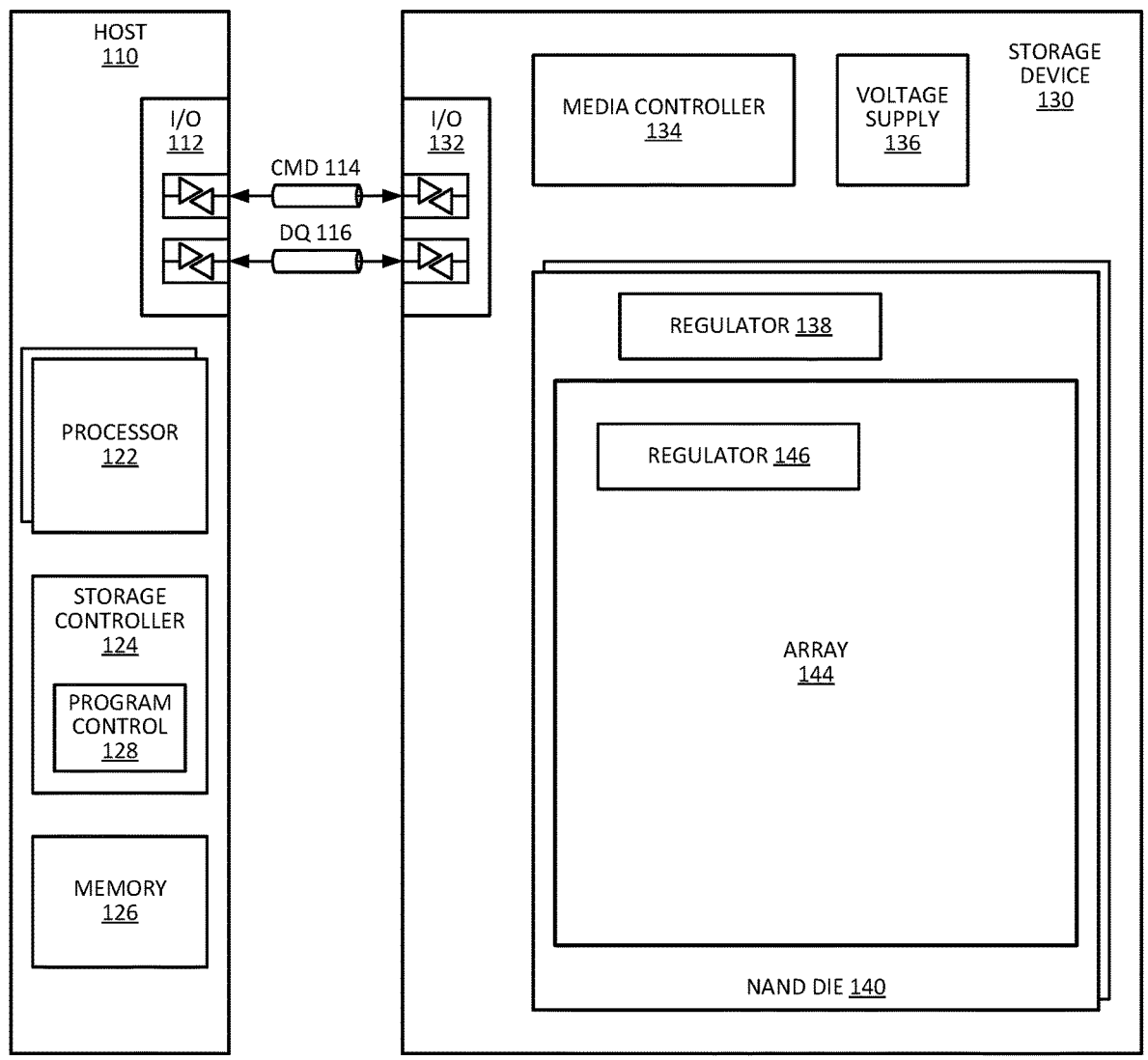
FIG. 1 is a block diagram of an example of a system with a storage device in which bitlines can be charged with an external regulator.

FIG. 1 is a block diagram of an example of a system with a storage device in which bitlines can be charged with an external regulator. System 100 includes host 110, which represents the host system to which storage device 130 is connected. Storage device 130 provides a storage resource to store data for host 110.

Host 110 includes processor 122, storage controller 124, and memory 126. Processor 122 represents a host processor or computing device for host 110, which can be a single core device or a multicore device. Storage controller 124 represents a controller in host 110 that manages access to storage device 130. Storage controller 124 can perform scheduling and manage timing and data transfer with storage device 130. In one example, storage controller 124 includes program control 128, which enables storage controller 124 to selectively send control signals to connect bitlines to different voltage regulators.

Memory 126 represents operational memory in host 110. The operational memory is typically volatile memory, which has indeterminate state if power is interrupted to the memory. The operational memory could alternatively be nonvolatile memory, which has determinate state even when power is interrupted to the memory. Memory 126 generally holds data and code for use by processor 122. Data read from storage device 130 is typically stored in memory 126 for use by processor 122.

Host 110 includes I/O (input/output) 112, which represents hardware to interface with an external device, such as storage device 130, which can represent a peripheral device. I/O 132 represents hardware of storage device 130 to interface with host 110 through I/O 112. In one example, the interconnection between I/O 112 and I/O 132 can include a command connection or command link or command bus, as represented by CMD (command) 114. The link/bus can be signal lines over which host 110 sends commands to storage device 130. The interconnection can include a data bus represented by DQ (data) 116.

Storage device 130 includes media controller 134, which represents a controller on the storage device to manage the NVM (nonvolatile memory) resources. Media controller 134 receives commands from storage controller 124 and decodes and executes the commands. Media controller 134 can send control signals to array 144 to implement program and read operations.

As illustrated, storage device 130 includes multiple NAND dies 140. In one example, NAND dies 140 include array 144. Array 144 can be a multilevel storage device, such as MLC (multilevel cell), TLC (triple level cell), QLC (quad level cell), or other encoding scheme. Array 144 includes N wordlines (WL[0] to WL[N−1]). Access to the columns, pillars or strings of the storage cells can be addressed by row (wordline or WL) address and column (bitline or BL) address, and gated with control gate signals.

In one example, array 144 includes multiple vertical stacks, with a stack corresponding to each bitline (e.g., BL[0], BL[1], . . . ). The vertical stack includes a vertical channel passing through the various wordlines, with the channel controlled by control gate signals. The control gate signals can be referred to as switching signals that provide gating control for a channel.

Voltage supply 136 represents a power supply in storage device 130. Voltage supply 136 can be or include a voltage regulator to provide power to the circuits to enable access to storage cells of array 144.

In one example, system 100 includes regulator 138 as part of NAND die 140 and regulator 146 as part of array 144. In one example, regulator 146 provides power to perform program operations for cells of array 144, and can be referred to as an internal regulator. Regulator 138 can be referred to as an external regulator, seeing it is outside the circuit that generally manages the charging of the bitlines. Regulator 138 has higher capacity than regulator 146. Thus, connection of the bitlines to regulator 146 for the charging for stabilization can reduce the risk of voltage drop when the bitlines draw current to charge up.

In one example, regulator 146, the internal regulator, is part of a NAND's SPBs (static page buffers), which can have the responsibility to charge up the inhibited bitlines to the inhibit (INH) voltage (e.g., VCC) before giving the programing pulse. As described herein, media controller 134 can connect the bitlines to the external power supply represented by regulator 138. In one example, regulator 138 is part of voltage supply 136. In one example, regulator 138 is connected to the bitlines right after the last verify. Connecting the bitlines right after the last verify, the system can charge the bitlines to VCC through the external source without risking voltage droop on the internal VCC in the logic circuits.

In one example, bitline separation and stabilization happens by discharging the selected bitlines ground, while inhibit bitlines can be kept at VCC. In the process, no sudden heavy charging burden would be required from the SPB nor the logic circuits. Thus, rather than the primary issue being to charge the bitlines, the primary issue is to discharge the charged bitlines. Discharging does not endanger the operation of the internal regulators and logic circuits.

Figure 2:
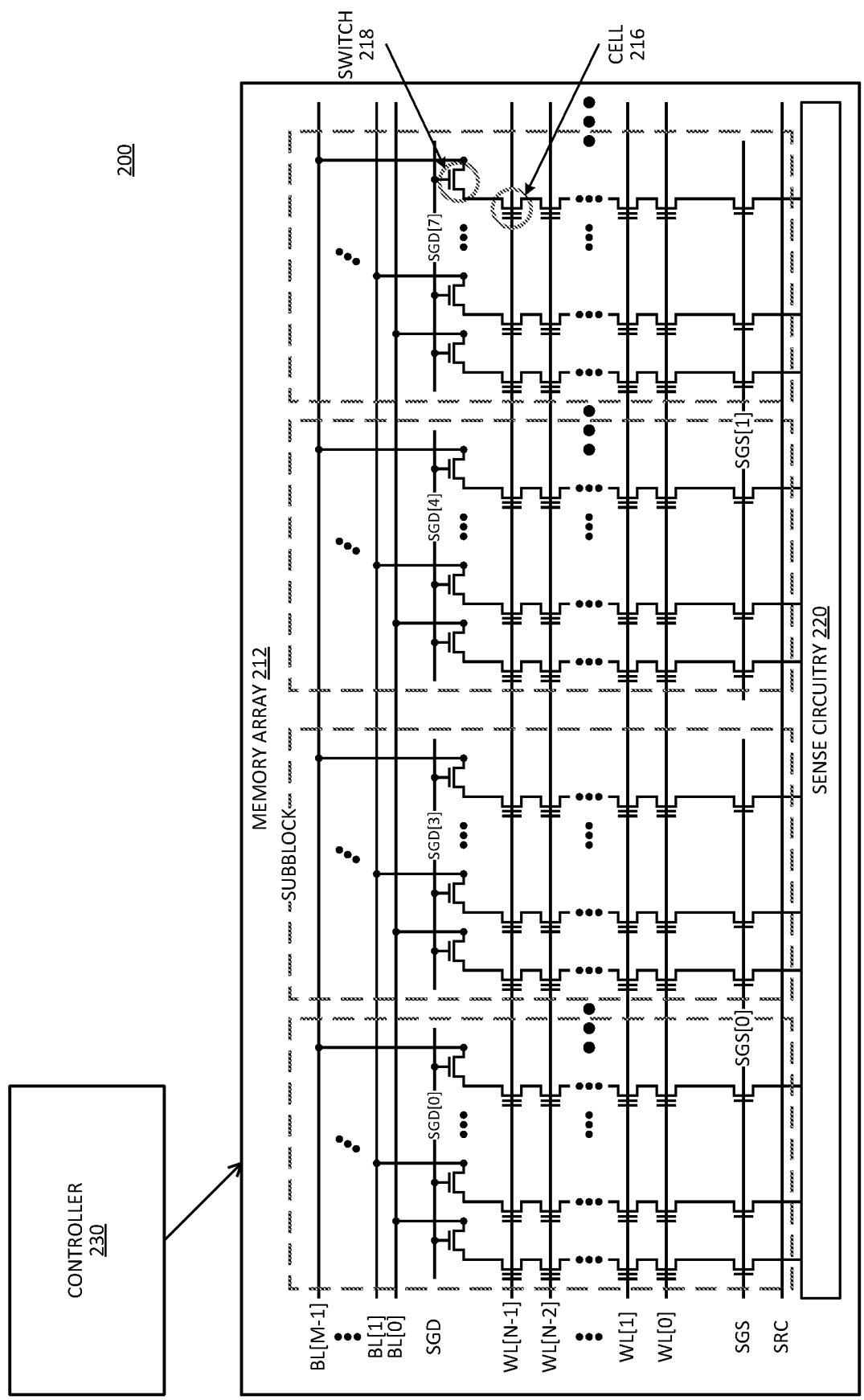
FIG. 2 is a block diagram of an example of a system having a storage array in which bitline charging with an external regulator can be implemented.

FIG. 2 is a block diagram of an example of a system having a storage array in which bitline charging with an external regulator can be implemented. System 200 represents a storage device in accordance with an example of system 100. System 200 can be, or be included in, an SSD (solid state drive). System 200 can be integrated into a computing device.

System 200 includes memory array 212, which represents a 3D NAND storage device, with multiple decks of stacked wordlines. In one example, cells 216 represent NAND storage cells. In one example, cells 216 represent NOR-based storage cells. Memory array 212 includes N wordlines (WL[0] to WL[N−1]).

In one example, memory array 212 is segmented into subblocks. A block of cells refers to cells coupled to the same SGS, with SGS[0] and SGS[1] illustrated. A subblock of cells refers to cells coupled to the same SGD, with SGD[0], SGD[1], SGD[7] illustrated. The separation with source and drain portions are only to be understood as illustrative and not limiting.

In one example, a subblock refers to the columns, pillars, or strings of storage cells 216 that are accessed together. The pillars can be accessed together by responding to a common switching signal. The switching signal can refer to gating control for the pillar. Switch 218 represents the gating control for the pillar. An SGD signal line selectively couples a column pillar to a BL (bitline). An SGS signal line selectively couples a column to a source (SRC), which is a source plane. The source can alternatively be referred to as an SL (source layer) or a slot, which is a source layer of material integrated onto a semiconductor substrate.

One bitline is coupled to different subblocks. Each subblock can be coupled to M bitlines (BL[0] to BL[M−1]). In one example, each storage cell 216 within memory array 212 is addressed or selected by asserting a wordline and a bitline, in conjunction with enabling the column with the gate select switches 218 (shown only on SGD, but SGS switches can be considered included in the control). System 200 illustrates sense circuitry 220, which represents the circuitry to stage data for reads and writes. In one example, sense circuitry 220 can represent the SPB (static page buffer).

In one example, system 200 includes controller 230 to apply control signals to selectively connect the bitlines to different voltage sources.

Figure 3:
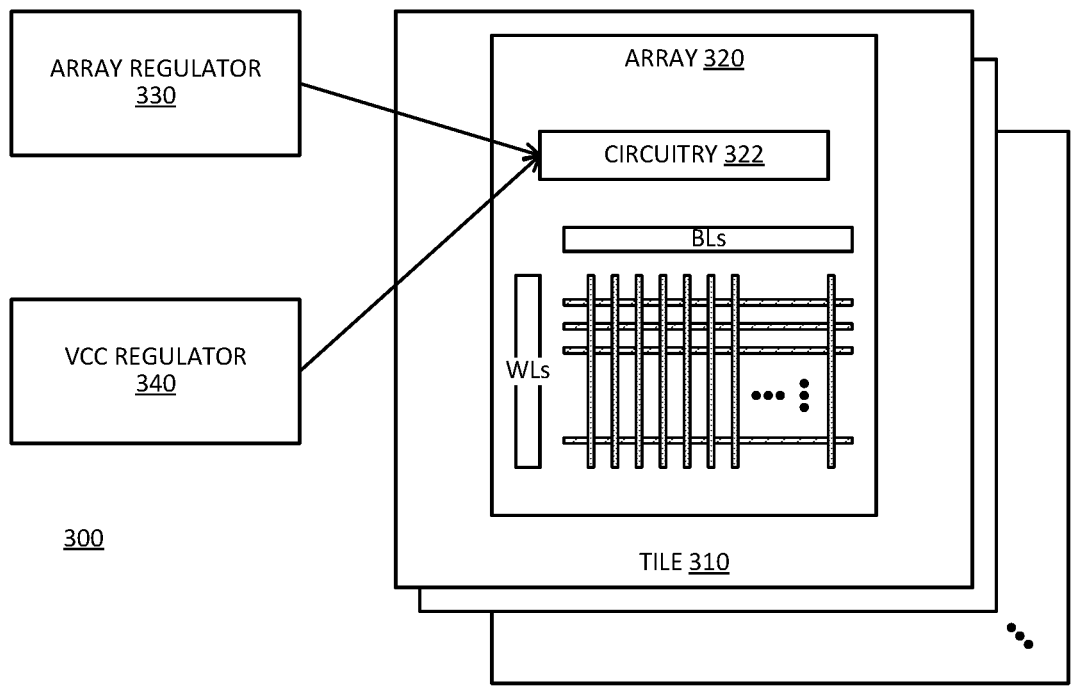
FIG. 3 is a block diagram of an example of a system that can selectively connect bitlines to different regulators.

FIG. 3 is a block diagram of an example of a system that can selectively connect bitlines to different regulators. System 300 illustrates a system in accordance with an example of system 100 or an example of system 200. System 300 includes multiple tiles 310, where a tile represents a storage device die.

Tile 310 can include array 320, which represents a nonvolatile storage array. The storage array includes storage cells at the intersections of WLs (wordlines) and BLs (bitlines). In one example, array 320 includes circuitry 322 to manage access to the storage cells. Circuitry 322 enables system 300 to connect bitlines to different regulators. Each tile 310 can include potentially thousands of bitlines. In one example, system 300 can include 32 tiles each having 16 thousand bitlines.

Array regulator 330 represents an internal regulator for system 300. VCC regulator 340 represents an external regulator for system 300. To charge the bitlines as quickly as possible, circuitry 322 can be dynamically configured to connect the bitlines to VCC regulator 340 instead of to array regulator 330.

In one example, a media controller (not specifically illustrated) of system 300 generates a control signal to connect the bitlines to array regulator 330. In one example, system 300 generates a different control signal to connect the bitlines to array regulator 340. In one example, system 300 generates a control signal to couple the source (not specifically illustrated) to a high voltage reference of the of the voltage regulator. In one example, system 300 connects the bitlines to VCC regulator 340 to charge the bitlines until transitioning to connecting the bitlines to array regulator 330.

Figure 4A:
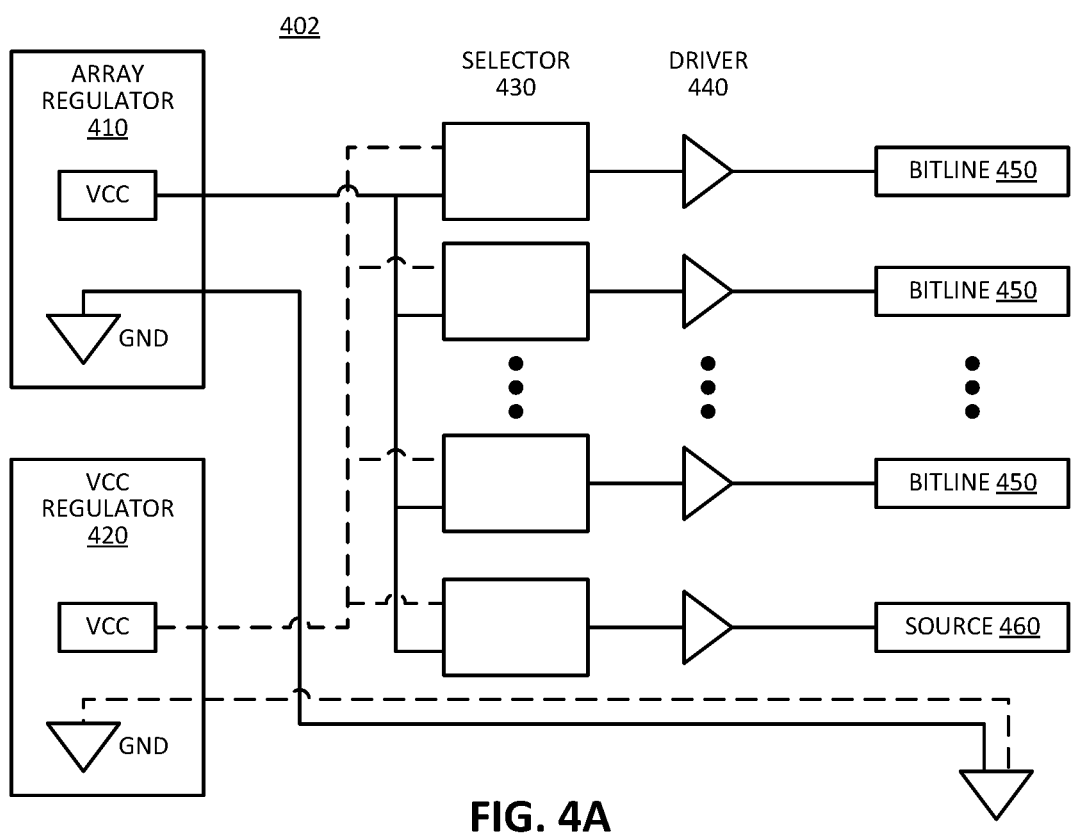
FIG. 4A is a block diagram of an example of connecting bitlines different regulators.

FIG. 4A is a block diagram of an example of connecting bitlines different regulators. System 402 represents portions of a system in accordance with system 100, system 200, or system 300.

System 402 illustrates array regulator 410 and VCC regulator 420 coupled to selectors 430. Selectors 430 can select between VCC of array regulator 410 and VCC of VCC regulator 420. In one example, the grounds (GND) of the regulators can be selected to provide a ground path for the bitlines and source. Thus, system 402 can also provide the low voltage reference or ground reference of the regulators for the bitline voltages.

System 402 includes drivers 440 to drive bitlines 450 with the voltage from the selected regulator. Drivers 440 represent circuitry to provide the selected voltage to the bitlines to charge them. In one example, system 402 can also couple source 460 to different voltage regulators. In an example where the bitlines are coupled to the source, source 460 can be selectively coupled to VCC regulator 420 instead of to array regulator 410.

Figure 4B:
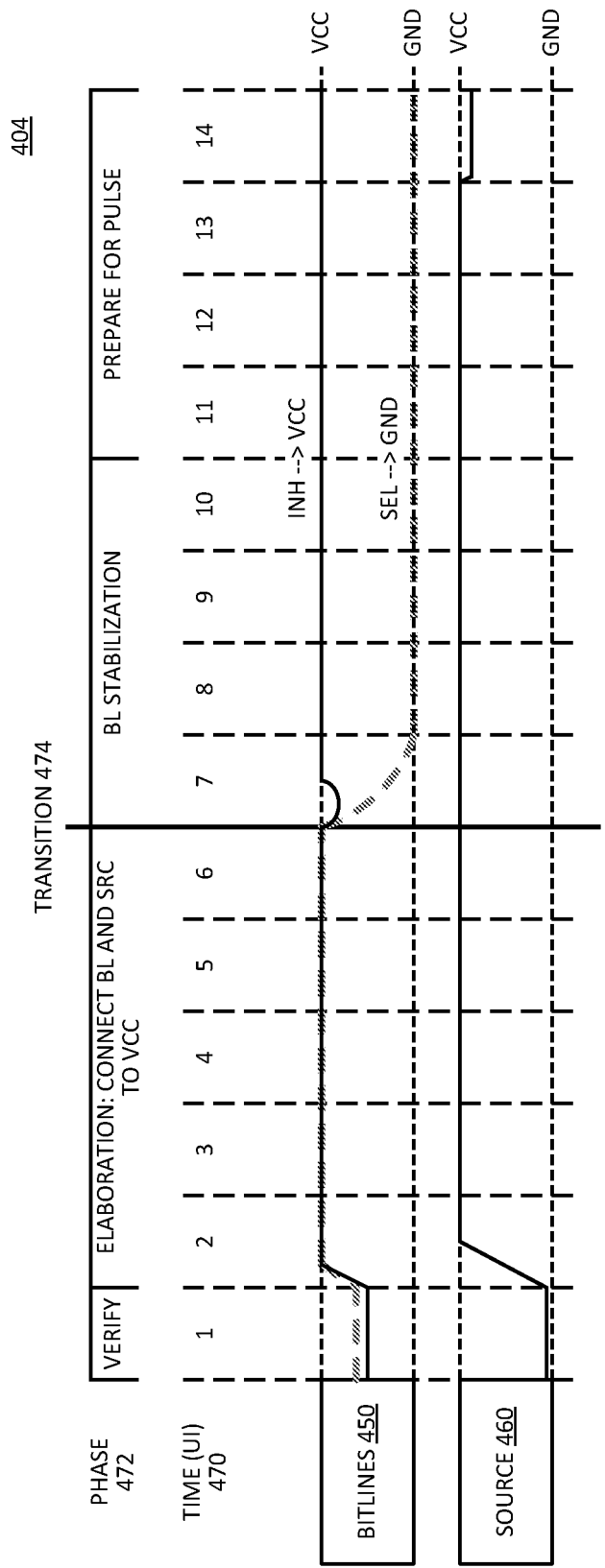
FIG. 4B is a diagram of a representation of the voltage curves over time for connecting bitlines to different regulators.

FIG. 4B is a diagram of a representation of the voltage curves over time for connecting bitlines to different regulators. Diagram 404 illustrates the voltage waveforms for bitlines 450 and source 460 for stabilizing the inhibit bitline in preparation for a program pulse in accordance with one example.

Row 470 indicates the time in unit intervals, with the first (1) through the fourteenth (14) unit intervals illustrated. Phase 472 indicates a phase of the program. In one example, time 1 represents an end of a verify phase, where source 460 can be at ground and bitlines 450 can be at a mid-level voltage. In one example, the bitlines and source are connected right after the verify is complete.

At time 2, bitlines 450 and source 460 are coupled to VCC. More specifically, time 2 starts the elaboration phase, and the system couples the bitlines and source to the external source instead of the internal source. The phase extends through time 6, where transition 474 occurs.

Transition 474 represents the point where the bitlines are separated, where the selected bitlines are driven to ground and the inhibit bitlines are driven high. In one example, the connection of the bitlines and source right after the verify to the external supply can bypass any internal regulation steps. After elaboration, the selected bitlines can be discharged while INH bitlines are regulated to VCC.

In one example, transition 474 is where the bitlines are transitioned from the external regulator to the internal regulator. Time 7 starts the bitline (BL) stabilization. Since the bitlines have all been driven high by the external regulator, bitline stabilization becomes mainly a discharging operation that does not burden the internal regulators or logic circuits with risky current spikes.

Bitline stabilization can last through time 10. Time 11 can start the preparation for the program pulse, which lasts through time 14, the last portion of the operation illustrated in diagram 404.

Figure 5:
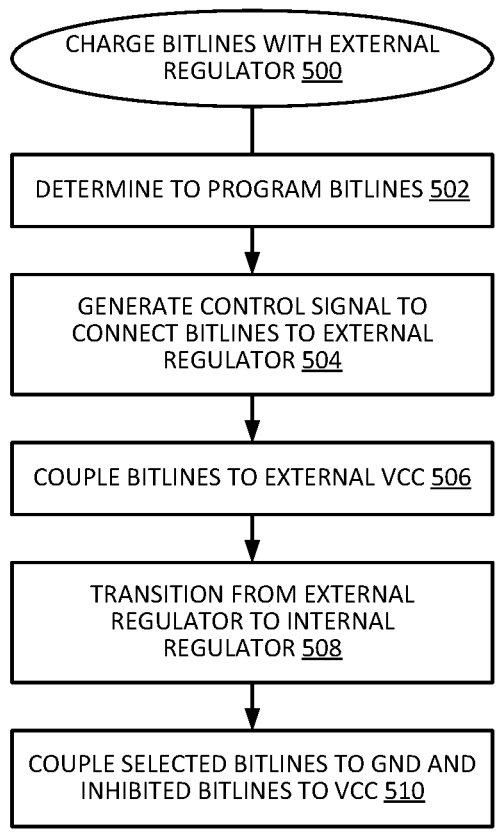
FIG. 5 is a flow diagram of a process for bitline charging with an external regulator.

FIG. 5 is a flow diagram of a process for bitline charging with an external regulator. Process 500 represents a process for charging the bitlines with an external regulator. The system can determine to program bitlines, at 502, including selecting the bitlines to program and which to inhibit.

In one example, the system generates a control signal to connect the bitlines to the external regulator, at 504. The application of the control signal causes the access circuitry to couple the bitlines to the external VCC, at 506.

In one example, the system transitions the bitlines from the external regulator to the internal regulator, at 508. The transition to the internal regulator can occur when the bitline stabilization is merely a discharging operation instead of a charging operation. Thus, the system can couple the selected bitlines to ground and the inhibited bitlines to VCC, at 510, in preparation for the program pulse.

Figure 6A:
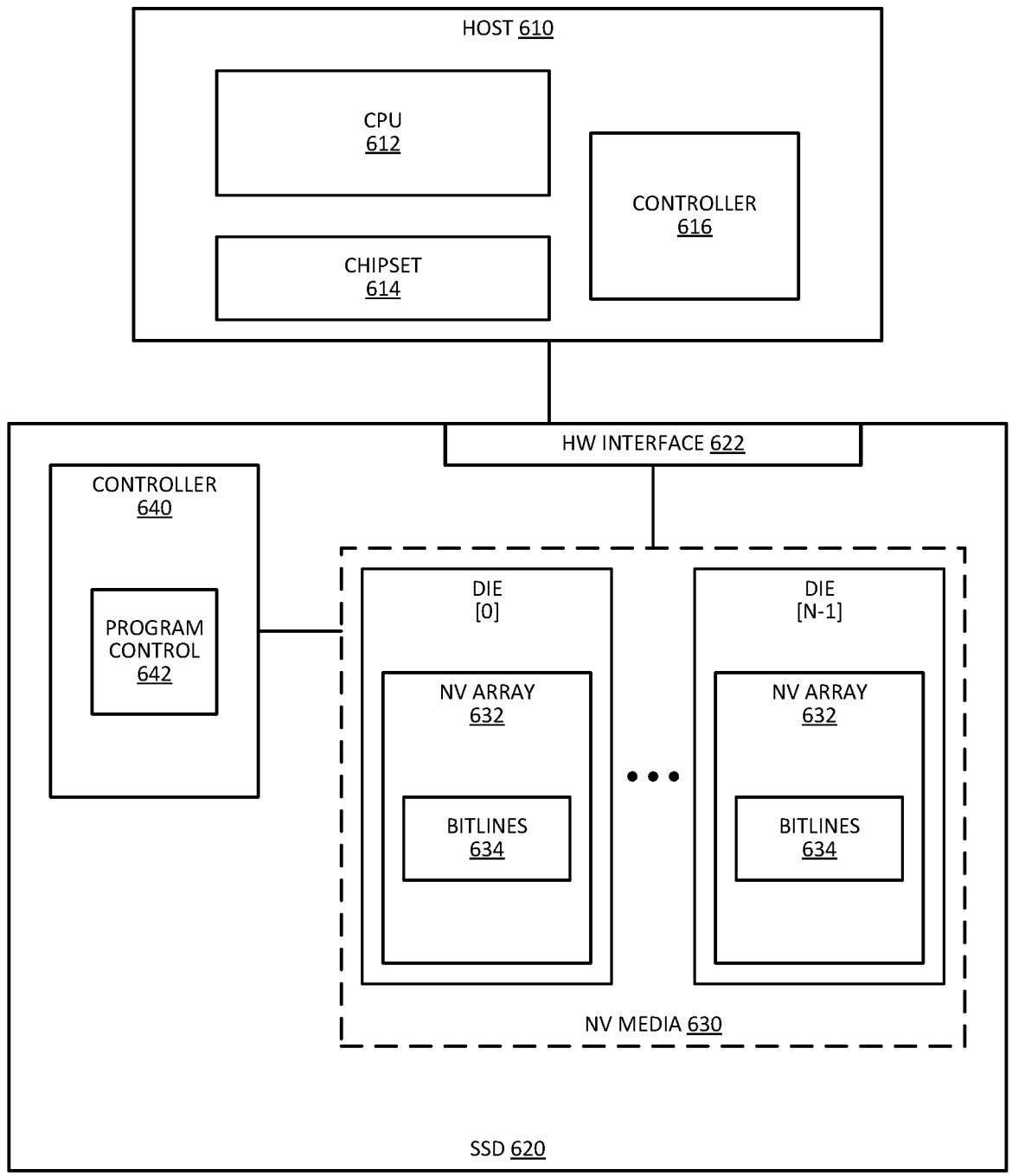
FIG. 6A is a block diagram of an example of a system with a solid state drive (SSD) in which bitline charging with an external regulator can be implemented.

FIG. 6A is a block diagram of an example of a system with a solid state drive (SSD) in which bitline charging with an external regulator can be implemented. System 602 represents components of a storage system in accordance with an example of system 100, system 200, or system 300. System 602 can be a 3D NAND storage device that supports verify of multiple subblocks simultaneously, in accordance with any example herein.

System 602 includes host 610 coupled to SSD 620. Host 610 represents a host hardware platform that connects to SSD 620. Host 610 includes CPU (central processing unit) 612 or other processor as a host processor or host processor device. CPU 612 represents any host processor that generates requests to access data stored on SSD 620, either to read the data or to write data to the storage. Such a processor can include a single or multicore processor, a primary processor for a computing device, a graphics processor, a peripheral processor, or a supplemental or auxiliary processor, or a combination. CPU 612 can execute a host OS and other applications to cause the operation of system 602.

Host 610 includes chipset 614, which represents hardware components such as interconnect circuits and logic to enable access to SSD 620. Host 610 includes controller 616, which represents a storage controller or memory controller on the host side to control access to SSD 620. In one example, controller 616 is included in chipset 614. In one example, controller 616 is included in CPU 612. Controller 616 can be referred to as an NV memory controller or storage controller to enable host 610 to schedule and organize commands to SSD 620 to read and write data.

SSD 620 represents a solid-state drive or other storage system or module that includes NV (nonvolatile) media 630 to store data. NV media 630 can be, for example, a 3D NAND array. SSD 620 includes HW (hardware) interface 622, which represents hardware components to interface with host 610. For example, HW interface 622 can interface with one or more buses to implement a high speed interface standard such as NVMe (nonvolatile memory express) or PCIe (peripheral component interconnect express).

In one example, NV media 630 is implemented as multiple dies, illustrated as N dies, Die[0:(N−1)]. N can be any number of devices, and is often a binary number. SSD 620 includes controller 640 to control access to NV media 630. Controller 640 represents hardware and control logic within SSD 620 to execute control over the media. Controller 640 is internal to the nonvolatile storage device or module, and is separate from controller 616 of host 610.

The NV dies of NV media 630 include 3D NV array 632, which is a three-dimensional array of storage cells based on the NV media. NV array 632 includes bitlines 634. In one example, controller 640 includes program control 642 to charge bitlines 634 with an external regulator, in accordance with any example herein.

Figure 6B:
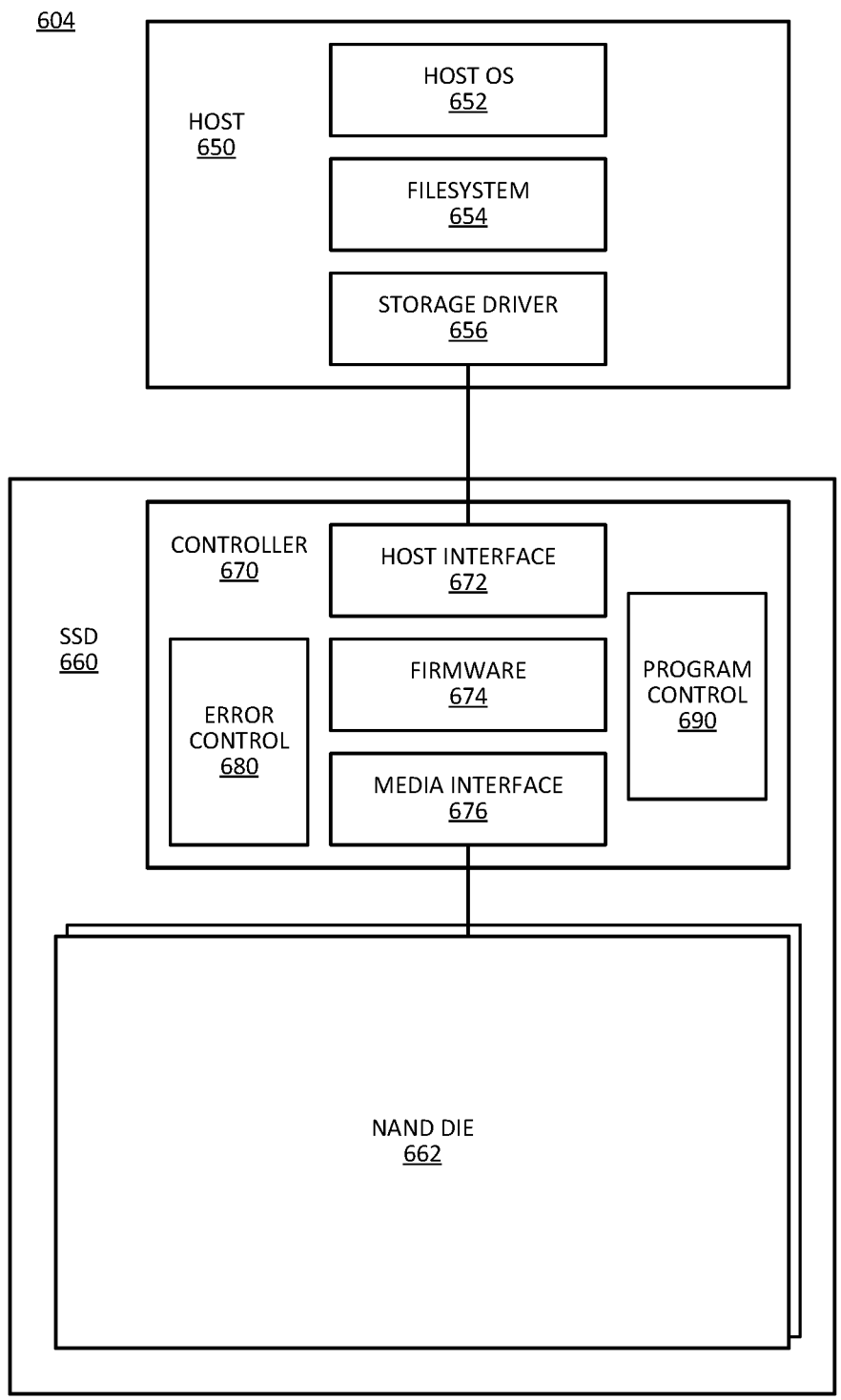
FIG. 6B is a block diagram of an example of a system with a solid state drive (SSD) with a controller to manage bitline charging with an external regulator.

FIG. 6B is a block diagram of an example of a system with a solid state drive (SSD) with a controller to manage bitline charging with an external regulator. System 604 provides one example of a system in accordance with system 602 of FIG. 6A. System 604 can represent software and firmware components of an example of system 602, as well as physical components. In one example, host 650 provides one example of host 610. In one example, SSD 660 provides one example of SSD 620.

In one example, host 650 includes host OS 652, which represents a host operating system or software platform for the host. Host OS 652 can include a platform on which applications, services, agents, and/or other software executes, and is executed by a processor. Filesystem 654 represents control logic for controlling access to the NV media. Filesystem 654 can manage what addresses or memory locations are used to store what data. There are numerous filesystems known, and filesystem 654 can implement known filesystems or other proprietary systems. In one example, filesystem 654 is part of host OS 652.

Storage driver 656 represents one or more system-level modules that control the hardware of host 650. In one example, drivers 656 include a software application to control the interface to SSD 660, and thus control the hardware of SSD 660. Storage driver 656 can provide a communication interface between the host and the SSD.

Controller 670 of SSD 660 includes firmware 674, which represents control software/firmware for the controller. In one example, controller 670 includes host interface 672, which represents an interface to host 650. In one example, controller 670 includes media interface 676, which represents an interface to NAND die 662. NAND die 662 represents a specific example of NV media, and includes an associated 3D NAND array.

Media interface 676 represents control that is executed on hardware of controller 670. It will be understood that controller 670 includes hardware to interface with host 650, which can be considered to be controlled by host interface software/firmware 674. Likewise, it will be understood that controller 670 includes hardware to interface with NAND die 662. In one example, code for host interface 672 can be part of firmware 674. In one example, code for media interface 676 can be part of firmware 674.

In one example, controller 670 includes error control 680 to handle data errors in accessed data, and corner cases in terms of compliance with signaling and communication interfacing. Error control 680 can include implementations in hardware or firmware, or a combination of hardware and software.

In one example, system 604 includes program control 690 to charge bitlines of NAND die 662 with an external regulator, in accordance with any example herein.

Figure 7:
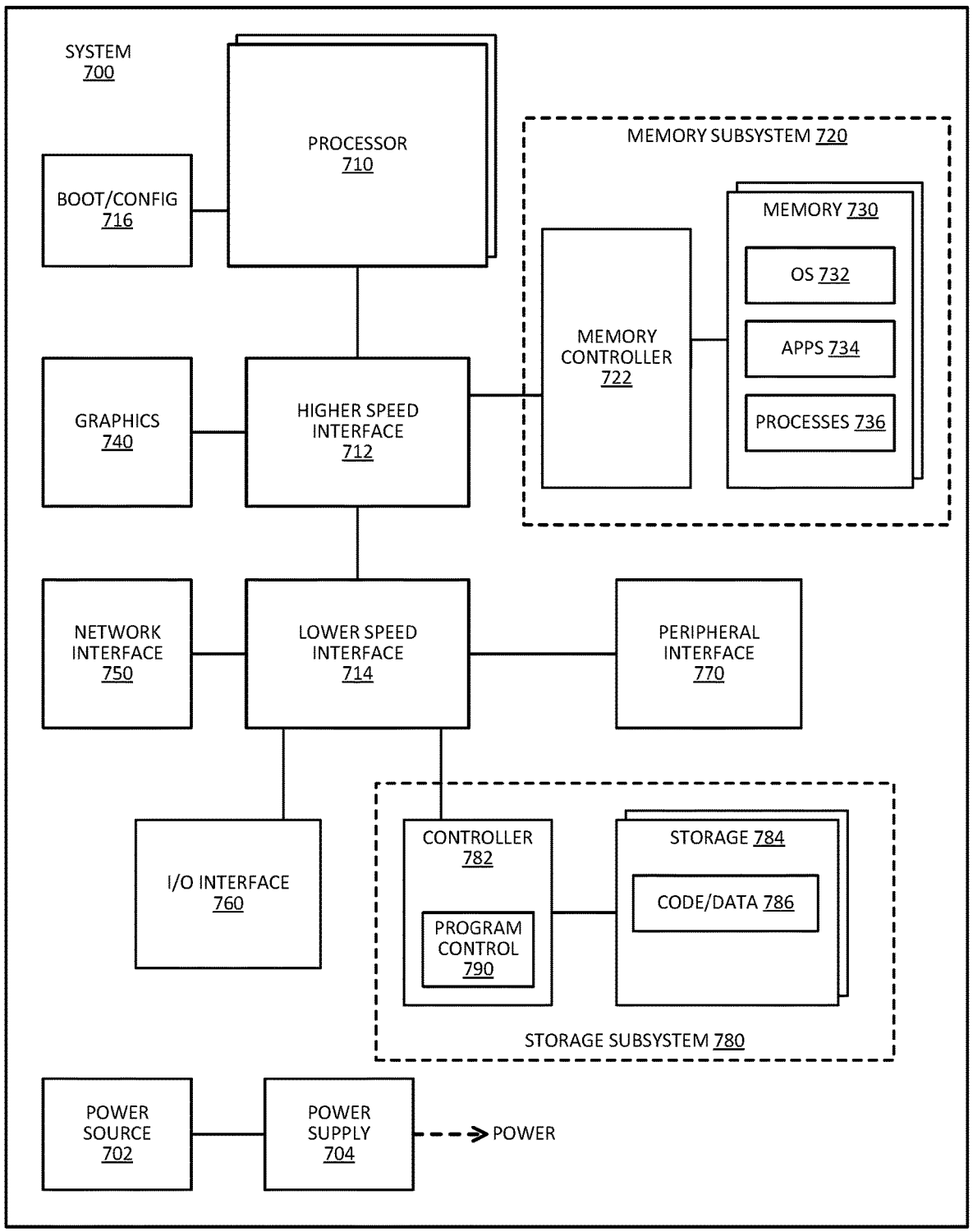
FIG. 7 is a block diagram of an example of a computing system in which bitline charging with an external regulator can be implemented.

FIG. 7 is a block diagram of an example of a computing system in which bitline charging with an external regulator can be implemented. System 700 represents a computing device in accordance with any example herein, and can be a laptop computer, a desktop computer, a tablet computer, a server, a gaming or entertainment control system, embedded computing device, or other electronic device.

System 700 represents a system with storage in accordance with an example of system 100, system 200, or system 300. In one example, controller 782 includes program control 790. Program control 790 enables system 700 to charge bitlines of storage 784 with an external regulator, in accordance with any example herein.

System 700 includes processor 710 can include any type of microprocessor, central processing unit (CPU), graphics processing unit (GPU), processing core, or other processing hardware, or a combination, to provide processing or execution of instructions for system 700. Processor 710 can be a host processor device. Processor 710 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or a combination of such devices.

System 700 includes boot/config 716, which represents storage to store boot code (e.g., basic input/output system (BIOS)), configuration settings, security hardware (e.g., trusted platform module (TPM)), or other system level hardware that operates outside of a host OS. Boot/config 716 can include a nonvolatile storage device, such as read-only memory (ROM), flash memory, or other memory devices.

In one example, system 700 includes interface 712 coupled to processor 710, which can represent a higher speed interface or a high throughput interface for system components that need higher bandwidth connections, such as memory subsystem 720 or graphics interface components 740. Interface 712 represents an interface circuit, which can be a standalone component or integrated onto a processor die. Interface 712 can be integrated as a circuit onto the processor die or integrated as a component on a system on a chip. Where present, graphics interface 740 interfaces to graphics components for providing a visual display to a user of system 700. Graphics interface 740 can be a standalone component or integrated onto the processor die or system on a chip. In one example, graphics interface 740 can drive a high definition (HD) display or ultra high definition (UHD) display that provides an output to a user. In one example, the display can include a touchscreen display. In one example, graphics interface 740 generates a display based on data stored in memory 730 or based on operations executed by processor 710 or both.

Memory subsystem 720 represents the main memory of system 700, and provides storage for code to be executed by processor 710, or data values to be used in executing a routine. Memory subsystem 720 can include one or more varieties of random-access memory (RAM) such as DRAM, 3DXP (three-dimensional crosspoint), or other memory devices, or a combination of such devices. Memory 730 stores and hosts, among other things, operating system (OS) 732 to provide a software platform for execution of instructions in system 700. Additionally, applications 734 can execute on the software platform of OS 732 from memory 730. Applications 734 represent programs that have their own operational logic to perform execution of one or more functions. Processes 736 represent agents or routines that provide auxiliary functions to OS 732 or one or more applications 734 or a combination. OS 732, applications 734, and processes 736 provide software logic to provide functions for system 700. In one example, memory subsystem 720 includes memory controller 722, which is a memory controller to generate and issue commands to memory 730. It will be understood that memory controller 722 could be a physical part of processor 710 or a physical part of interface 712. For example, memory controller 722 can be an integrated memory controller, integrated onto a circuit with processor 710, such as integrated onto the processor die or a system on a chip.

While not specifically illustrated, it will be understood that system 700 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 700 includes interface 714, which can be coupled to interface 712. Interface 714 can be a lower speed interface than interface 712. In one example, interface 714 represents an interface circuit, which can include stand-alone components and integrated circuitry. In one example, multiple user interface components or peripheral components, or both, couple to interface 714. Network interface 750 provides system 700 the ability to communicate with remote devices (e.g., servers or other computing devices) over one or more networks. Network interface 750 can include an Ethernet adapter, wireless interconnection components, cellular network interconnection components, USB (universal serial bus), or other wired or wireless standards-based or proprietary network interface circuit. Network interface 750 can exchange data with a remote device, which can include sending data stored in memory or receiving data to be stored in memory.

In one example, system 700 includes one or more input/output (I/O) interface(s) 760. I/O interface 760 can include one or more interface components through which a user interacts with system 700 (e.g., audio, alphanumeric, tactile/touch, or other interfacing). Peripheral interface 770 can include any hardware interface not specifically mentioned above. Peripherals refer generally to devices that connect dependently to system 700. A dependent connection is one where system 700 provides the software platform or hardware platform or both on which operation executes, and with which a user interacts.

In one example, system 700 includes storage subsystem 780 to store data in a nonvolatile manner. In one example, in certain system implementations, at least certain components of storage 780 can overlap with components of memory subsystem 720. Storage subsystem 780 includes storage device(s) 784, which can be or include any conventional medium for storing large amounts of data in a nonvolatile manner, such as one or more magnetic, solid state, NAND, 3DXP, or optical based disks, or a combination. Storage 784 holds code or instructions and data 786 in a persistent state (i.e., the value is retained despite interruption of power to system 700). Storage 784 can be generically considered to be a "memory," although memory 730 is typically the executing or operating memory to provide instructions to processor 710. Whereas storage 784 is nonvolatile, memory 730 can include volatile memory (i.e., the value or state of the data is indeterminate if power is interrupted to system 700). In one example, storage subsystem 780 includes controller 782 to interface with storage 784. In one example controller 782 is a physical part of interface 714 or processor 710, or can include circuits or logic in both processor 710 and interface 714.

Power source 702 provides power to the components of system 700. More specifically, power source 702 typically interfaces to one or multiple power supplies 704 in system 700 to provide power to the components of system 700. In one example, power supply 704 includes an AC to DC (alternating current to direct current) adapter to plug into a wall outlet. Such AC power can be renewable energy (e.g., solar power) power source 702. In one example, power source 702 includes a DC power source, such as an external AC to DC converter. In one example, power source 702 or power supply 704 includes wireless charging hardware to charge via proximity to a charging field. In one example, power source 702 can include an internal battery or fuel cell source.

Figure 8:
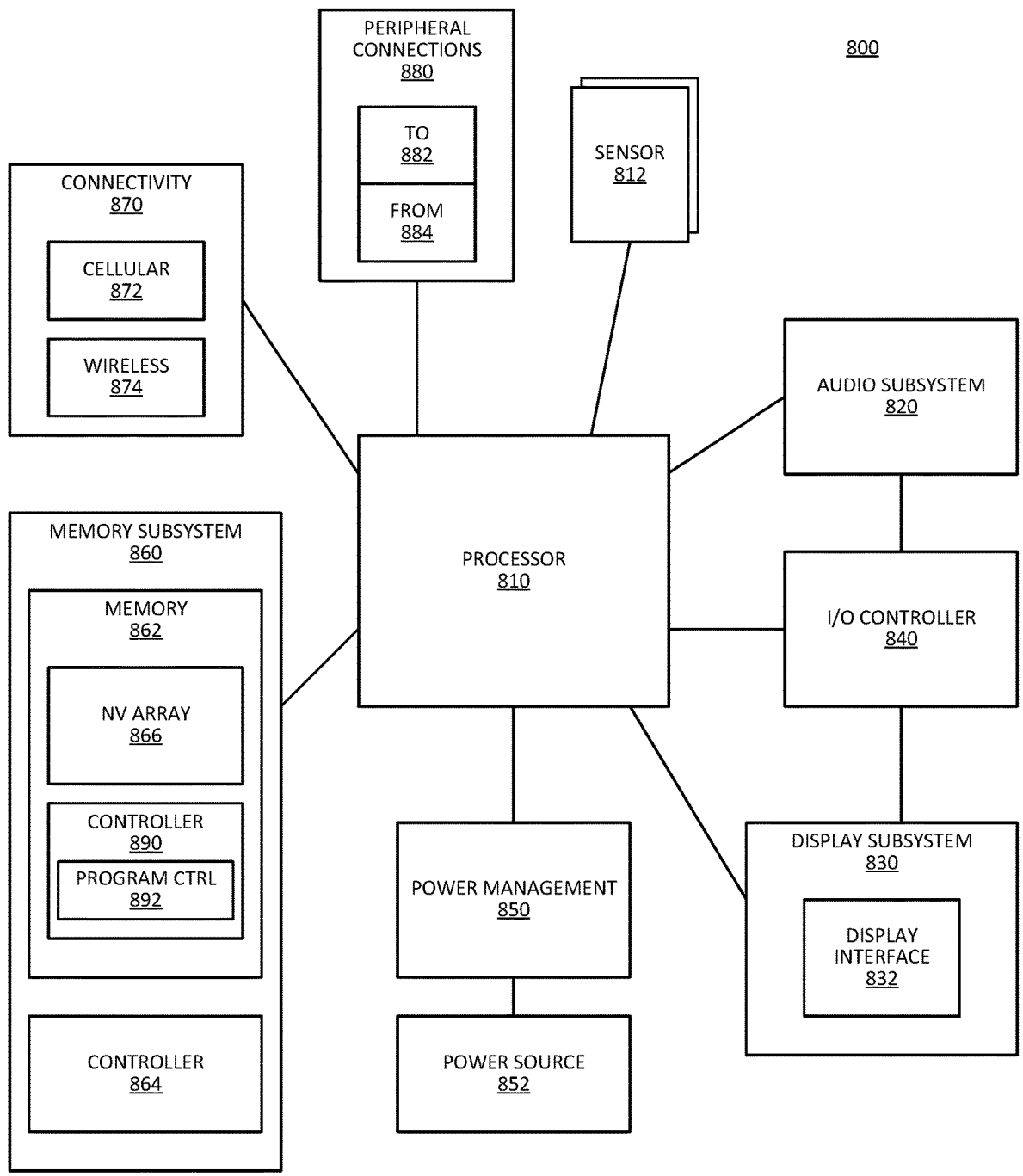
FIG. 8 is a block diagram of an example of a mobile device in which bitline charging with an external regulator can be implemented.

FIG. 8 is a block diagram of an example of a mobile device in which bitline charging with an external regulator can be implemented. System 800 represents a mobile computing device, such as a computing tablet, a mobile phone or smartphone, wearable computing device, or other mobile device, or an embedded computing device. It will be understood that certain of the components are shown generally, and not all components of such a device are shown in system 800.

System 800 represents a system with storage in accordance with an example of system 100, system 200, or system 300. In one example, controller 890 includes program control (CTRL) 892. Program control 892 enables system 800 to charge bitlines of NV array 866 with an external regulator, in accordance with any example herein.

System 800 includes processor 810, which performs the primary processing operations of system 800. Processor 810 can be a host processor device. Processor 810 can include one or more physical devices, such as microprocessors, application processors, microcontrollers, programmable logic devices, or other processing means. The processing operations performed by processor 810 include the execution of an operating platform or operating system on which applications and device functions are executed. The processing operations include operations related to I/O (input/output) with a human user or with other devices, operations related to power management, operations related to connecting system 800 to another device, or a combination. The processing operations can also include operations related to audio I/O, display I/O, or other interfacing, or a combination. Processor 810 can execute data stored in memory. Processor 810 can write or edit data stored in memory.

In one example, system 800 includes one or more sensors 812. Sensors 812 represent embedded sensors or interfaces to external sensors, or a combination. Sensors 812 enable system 800 to monitor or detect one or more conditions of an environment or a device in which system 800 is implemented. Sensors 812 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 812 can also include sensors for biometric systems such as fingerprint recognition systems, face detection or recognition systems, or other systems that detect or recognize user features. Sensors 812 should be understood broadly, and not limiting on the many different types of sensors that could be implemented with system 800. In one example, one or more sensors 812 couples to processor 810 via a frontend circuit integrated with processor 810. In one example, one or more sensors 812 couples to processor 810 via another component of system 800.

In one example, system 800 includes audio subsystem 820, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 800, or connected to system 800. In one example, a user interacts with system 800 by providing audio commands that are received and processed by processor 810.

Display subsystem 830 represents hardware (e.g., display devices) and software components (e.g., drivers) that provide a visual display for presentation to a user. In one example, the display includes tactile components or touchscreen elements for a user to interact with the computing device. Display subsystem 830 includes display interface 832, which includes the particular screen or hardware device used to provide a display to a user. In one example, display interface 832 includes logic separate from processor 810 (such as a graphics processor) to perform at least some processing related to the display. In one example, display subsystem 830 includes a touchscreen device that provides both output and input to a user. In one example, display subsystem 830 includes a high definition (HD) or ultra-high definition (UHD) display that provides an output to a user. In one example, display subsystem includes or drives a touchscreen display. In one example, display subsystem 830 generates display information based on data stored in memory or based on operations executed by processor 810 or both.

I/O controller 840 represents hardware devices and software components related to interaction with a user. I/O controller 840 can operate to manage hardware that is part of audio subsystem 820, or display subsystem 830, or both. Additionally, I/O controller 840 illustrates a connection point for additional devices that connect to system 800 through which a user might interact with the system. For example, devices that can be attached to system 800 might include microphone devices, speaker or stereo systems, video systems or other display device, keyboard or keypad devices, buttons/switches, or other I/O devices for use with specific applications such as card readers or other devices.

As mentioned above, I/O controller 840 can interact with audio subsystem 820 or display subsystem 830 or both. For example, input through a microphone or other audio device can provide input or commands for one or more applications or functions of system 800. Additionally, audio output can be provided instead of or in addition to display output. In another example, if display subsystem includes a touchscreen, the display device also acts as an input device, which can be at least partially managed by I/O controller 840. There can also be additional buttons or switches on system 800 to provide I/O functions managed by I/O controller 840.

In one example, I/O controller 840 manages devices such as accelerometers, cameras, light sensors or other environmental sensors, gyroscopes, global positioning system (GPS), or other hardware that can be included in system 800, or sensors 812. The input can be part of direct user interaction, as well as providing environmental input to the system to influence its operations (such as filtering for noise, adjusting displays for brightness detection, applying a flash for a camera, or other features).

In one example, system 800 includes power management 850 that manages battery power usage, charging of the battery, and features related to power saving operation. Power management 850 manages power from power source 852, which provides power to the components of system 800. In one example, power source 852 includes an AC to DC (alternating current to direct current) adapter to plug into a wall outlet. Such AC power can be renewable energy (e.g., solar power, motion based power). In one example, power source 852 includes only DC power, which can be provided by a DC power source, such as an external AC to DC converter. In one example, power source 852 includes wireless charging hardware to charge via proximity to a charging field. In one example, power source 852 can include an internal battery or fuel cell source.

Memory subsystem 860 includes memory device(s) 862 for storing information in system 800. Memory subsystem 860 can include nonvolatile (state does not change if power to the memory device is interrupted) or volatile (state is indeterminate if power to the memory device is interrupted) memory devices, or a combination. Memory 860 can store application data, user data, music, photos, documents, or other data, as well as system data (whether long-term or temporary) related to the execution of the applications and functions of system 800. In one example, memory subsystem 860 includes memory controller 864 (which could also be considered part of the control of system 800, and could potentially be considered part of processor 810). Memory controller 864 includes a scheduler to generate and issue commands to control access to memory device 862.

Connectivity 870 includes hardware devices (e.g., wireless or wired connectors and communication hardware, or a combination of wired and wireless hardware) and software components (e.g., drivers, protocol stacks) to enable system 800 to communicate with external devices. The external device could be separate devices, such as other computing devices, wireless access points or base stations, as well as peripherals such as headsets, printers, or other devices. In one example, system 800 exchanges data with an external device for storage in memory or for display on a display device. The exchanged data can include data to be stored in memory, or data already stored in memory, to read, write, or edit data.

Connectivity 870 can include multiple different types of connectivity. To generalize, system 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 874 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that system 800 could both be a peripheral device ("to" 882) to other computing devices, as well as have peripheral devices ("from" 884) connected to it. System 800 commonly has a "docking" connector to connect to other computing devices for purposes such as managing (e.g., downloading, uploading, changing, synchronizing) content on system 800. Additionally, a docking connector can allow system 800 to connect to certain peripherals that allow system 800 to control content output, for example, to audiovisual or other systems.

In addition to a proprietary docking connector or other proprietary connection hardware, system 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Figure 9:
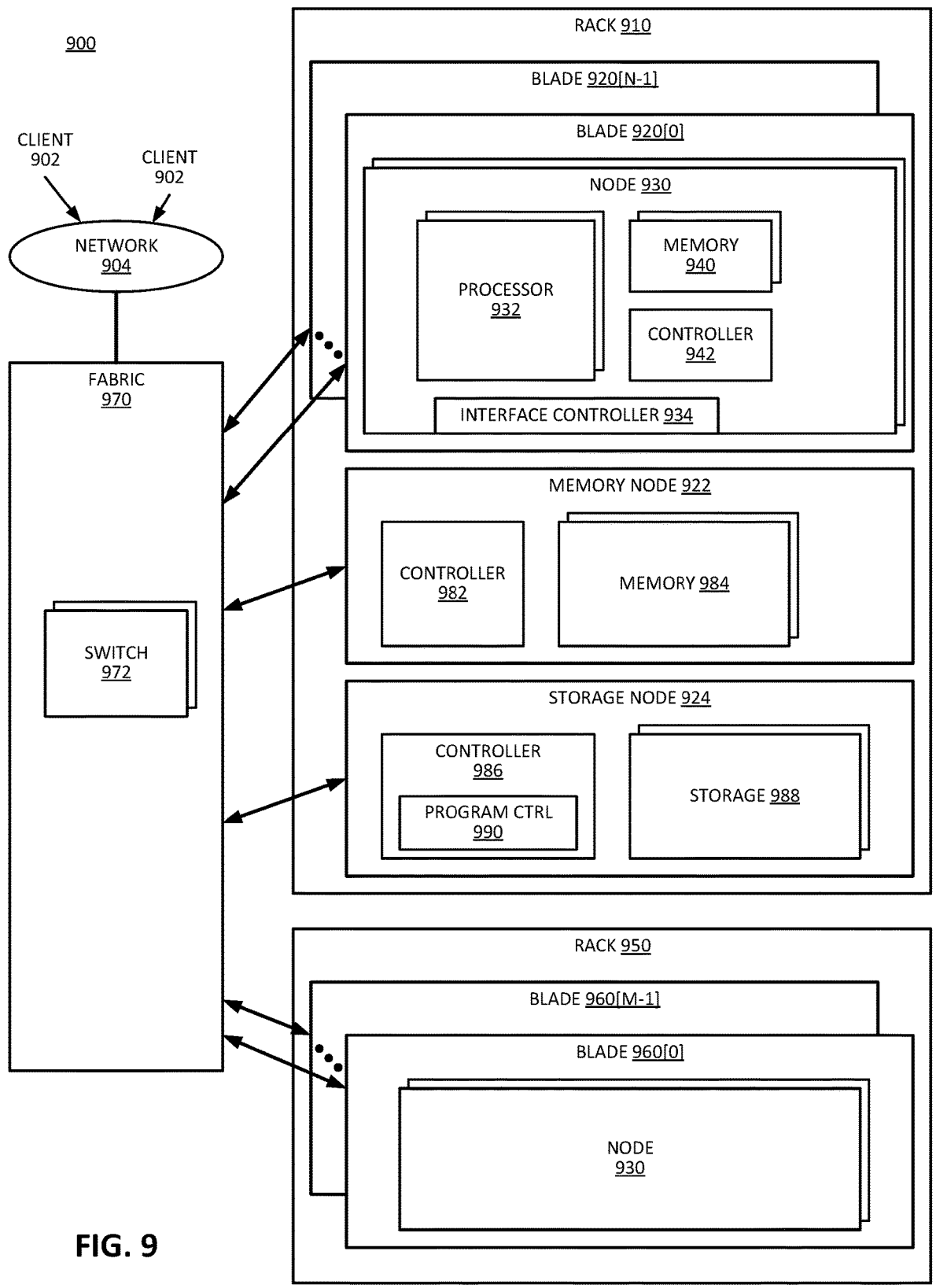
FIG. 9 is a block diagram of an example of a multi-node network in which bitline charging with an external regulator can be implemented.

FIG. 9 is a block diagram of an example of a multi-node network in which bitline charging with an external regulator can be implemented. In one example, system 900 represents a data center. In one example, system 900 represents a server farm. In one example, system 900 represents a data cloud or a processing cloud.

System 900 represents a system with storage in accordance with an example of system 100, system 200, or system 300. In one example, controller 986 includes program control (CTRL) 990. Program control 990 enables system 900 to charge bitlines of storage 988 with an external regulator, in accordance with any example herein.

One or more clients 902 make requests over network 904 to system 900. Network 904 represents one or more local networks, or wide area networks, or a combination. Clients 902 can be human or machine clients, which generate requests for the execution of operations by system 900. System 900 executes applications or data computation tasks requested by clients 902.

In one example, system 900 includes one or more racks, which represent structural and interconnect resources to house and interconnect multiple computation nodes. In one example, rack 910 includes multiple nodes 930. In one example, rack 910 hosts multiple blade components, blade 920[0], ..., blade 920[N−1], collectively blades 920. Hosting refers to providing power, structural or mechanical support, and interconnection. Blades 920 can refer to computing resources on printed circuit boards (PCBs), where a PCB houses the hardware components for one or more nodes 930. In one example, blades 920 do not include a chassis or housing or other "box" other than that provided by rack 910. In one example, blades 920 include housing with exposed connector to connect into rack 910. In one example, system 900 does not include rack 910, and each blade 920 includes a chassis or housing that can stack or otherwise reside in close proximity to other blades and allow interconnection of nodes 930.

System 900 includes fabric 970, which represents one or more interconnectors for nodes 930. In one example, fabric 970 includes multiple switches 972 or routers or other hardware to route signals among nodes 930. Additionally, fabric 970 can couple system 900 to network 904 for access by clients 902. In addition to routing equipment, fabric 970 can be considered to include the cables or ports or other hardware equipment to couple nodes 930 together. In one example, fabric 970 has one or more associated protocols to manage the routing of signals through system 900. In one example, the protocol or protocols is at least partly dependent on the hardware equipment used in system 900.

As illustrated, rack 910 includes N blades 920. In one example, in addition to rack 910, system 900 includes rack 950. As illustrated, rack 950 includes M blade components, blade 960[0], ..., blade 960[M−1], collectively blades 960. M is not necessarily the same as N; thus, it will be understood that various different hardware equipment components could be used, and coupled together into system 900 over fabric 970. Blades 960 can be the same or similar to blades 920. Nodes 930 can be any type of node and are not necessarily all the same type of node. System 900 is not limited to being homogenous, nor is it limited to not being homogenous.

The nodes in system 900 can include compute nodes, memory nodes, storage nodes, accelerator nodes, or other nodes. Rack 910 is represented with memory node 922 and storage node 924, which represent shared system memory resources, and shared persistent storage, respectively. One or more nodes of rack 950 can be a memory node or a storage node.

Nodes 930 represent examples of compute nodes. For simplicity, only the compute node in blade 920[0] is illustrated in detail. However, other nodes in system 900 can be the same or similar. At least some nodes 930 are computation nodes, with processor (proc) 932 and memory 940. A computation node refers to a node with processing resources (e.g., one or more processors) that executes an operating system and can receive and process one or more tasks. In one example, at least some nodes 930 are server nodes with a server as processing resources represented by processor 932 and memory 940.

Memory node 922 represents an example of a memory node, with system memory external to the compute nodes. Memory nodes can include controller 982, which represents a processor on the node to manage access to the memory. The memory nodes include memory 984 as memory resources to be shared among multiple compute nodes.

Storage node 924 represents an example of a storage server, which refers to a node with more storage resources than a computation node, and rather than having processors for the execution of tasks, a storage server includes processing resources to manage access to the storage nodes within the storage server. Storage nodes can include controller 986 to manage access to the storage 988 of the storage node.

In one example, node 930 includes interface controller 934, which represents logic to control access by node 930 to fabric 970. The logic can include hardware resources to interconnect to the physical interconnection hardware. The logic can include software or firmware logic to manage the interconnection. In one example, interface controller 934 is or includes a host fabric interface, which can be a fabric interface in accordance with any example described herein. The interface controllers for memory node 922 and storage node 924 are not explicitly shown.

Processor 932 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory 940 can be or include memory devices represented by memory 940 and a memory controller represented by controller 942.

In general with respect to the descriptions herein, in one aspect, a storage device includes: a nonvolatile storage medium having storage cells coupled to bitlines; and a media controller to generate a control signal after performing a program verify, to connect bitlines of the nonvolatile storage medium to an external regulator instead of an internal regulator to charge the bitlines, and then to connect the bitlines to the internal regulator to prepare the bitlines for a program pulse.

In accordance with one example of the storage device, the media controller is to generate the control signal directly after a last verify operation. In accordance with any preceding example of the storage device, in one example, the control signal comprises a first control signal, wherein the bitlines are coupled to a source through the storage cells, and wherein the media controller is to generate a second control signal to couple the source to a high voltage reference (VCC) of the external regulator. In accordance with any preceding example of the storage device, in one example, the bitlines are coupled to the source until the media controller is to connect the bitlines to the internal regulator. In accordance with any preceding example of the storage device, in one example, the media controller is to connect selected bitlines to a ground reference of the internal regulator and connect inhibited bitlines to a VCC of the internal regulator. In accordance with any preceding example of the storage device, in one example, the nonvolatile storage medium comprises a three-dimensional (3D) NAND storage medium.

In general with respect to the descriptions herein, in one aspect, a system includes: a processor device; and a storage device coupled to the processor device, the storage device including a nonvolatile storage medium having storage cells coupled to bitlines; and a media controller to generate a control signal after performing a program verify, to connect bitlines of the nonvolatile storage medium to an external regulator instead of an internal regulator to charge the bitlines, and then to connect the bitlines to the internal regulator to prepare the bitlines for a program pulse.

In accordance with one example of the system, the media controller is to generate the control signal directly after a last verify operation. In accordance with any preceding example of the system, in one example, the control signal comprises a first control signal, wherein the bitlines are coupled to a source through the storage cells, and wherein the media controller is to generate a second control signal to couple the source to a high voltage reference (VCC) of the external regulator. In accordance with any preceding example of the system, in one example, the bitlines are coupled to the source until the media controller is to connect the bitlines to the internal regulator. In accordance with any preceding example of the system, in one example, the media controller is to connect selected bitlines to a ground reference of the internal regulator and connect inhibited bitlines to a VCC of the internal regulator. In accordance with any preceding example of the system, in one example, the nonvolatile storage medium comprises a three-dimensional (3D) NAND storage medium. In accordance with any preceding example of the system, in one example, the processor device comprises a multicore processor. In accordance with any preceding example of the system, in one example, the system includes a display communicatively coupled to the processor device. In accordance with any preceding example of the system, in one example, the system includes a battery to power the system. In accordance with any preceding example of the system, in one example, the system includes a network interface circuit to couple with a remote device over a network connection.

In general with respect to the descriptions herein, in one aspect, a method for performing read verify in a storage device includes: generating a control signal after performing a program verify, the control signal to connect bitlines of a nonvolatile storage medium of the storage device to an external regulator instead of an internal regulator to charge the bitlines; and subsequently connecting the bitlines to the internal regulator to prepare the bitlines for a program pulse.

In accordance with one example of the method, generating the control signal comprises generating the control signal directly after a last verify operation. In accordance with any preceding example of the method, in one example, the control signal comprises a first control signal, wherein the bitlines are coupled to a source through storage cells, and further comprising generating a second control signal to couple the source to a high voltage reference (VCC) of the external regulator. In accordance with any preceding example of the method, in one example, the bitlines are coupled to the source until connecting the bitlines to the internal regulator. In accordance with any preceding example of the method, in one example, connecting the bitlines to the internal regulator comprises connecting selected bitlines to a ground reference of the internal regulator and connecting inhibited bitlines to a VCC of the internal regulator.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A storage device comprising:
 a nonvolatile storage medium having storage cells coupled to bitlines; and
 a media controller to generate a control signal after performing a program verify, to connect bitlines of the nonvolatile storage medium to an external regulator instead of an internal regulator to charge the bitlines, and then to connect the bitlines to the internal regulator to prepare the bitlines for a program pulse.

2. The storage device of claim 1, wherein the media controller is to generate the control signal directly after a last verify operation.

3. The storage device of claim 1, wherein the control signal comprises a first control signal, wherein the bitlines are coupled to a source through the storage cells, and wherein the media controller is to generate a second control signal to couple the source to a high voltage reference (VCC) of the external regulator.

4. The storage device of claim 3, wherein the bitlines are coupled to the source until the media controller is to connect the bitlines to the internal regulator.

5. The storage device of claim 1, wherein the media controller is to connect selected bitlines to a ground reference of the internal regulator and connect inhibited bitlines to a VCC of the internal regulator.

6. The storage device of claim 1, wherein the nonvolatile storage medium comprises a three-dimensional (3D) NAND storage medium.

7. A system comprising:
 a processor device; and
 a storage device coupled to the processor device, the storage device including
 a nonvolatile storage medium having storage cells coupled to bitlines; and
 a media controller to generate a control signal after performing a program verify, to connect bitlines of the nonvolatile storage medium to an external regulator instead of an internal regulator to charge the bitlines, and then to connect the bitlines to the internal regulator to prepare the bitlines for a program pulse.

8. The system of claim 7, wherein the media controller is to generate the control signal directly after a last verify operation.

9. The system of claim 7, wherein the control signal comprises a first control signal, wherein the bitlines are coupled to a source through the storage cells, and wherein the media controller is to generate a second control signal to couple the source to a high voltage reference (VCC) of the external regulator.

10. The system of claim 9, wherein the bitlines are coupled to the source until the media controller is to connect the bitlines to the internal regulator.

11. The system of claim 7, wherein the media controller is to connect selected bitlines to a ground reference of the internal regulator and connect inhibited bitlines to a VCC of the internal regulator.

12. The system of claim 7, wherein the nonvolatile storage medium comprises a three-dimensional (3D) NAND storage medium.

13. The system of claim 7,
 wherein the processor device comprises a multicore processor;
 further comprising a display communicatively coupled to the processor device;
 further comprising a battery to power the system; or
 further comprising a network interface circuit to couple with a remote device over a network connection.

14. A method for performing read verify in a storage device, comprising:
 generating a control signal after performing a program verify, the control signal to connect bitlines of a nonvolatile storage medium of the storage device to an external regulator instead of an internal regulator to charge the bitlines; and
 subsequently connecting the bitlines to the internal regulator to prepare the bitlines for a program pulse.

15. The method of claim 14, wherein generating the control signal comprises generating the control signal directly after a last verify operation.

16. The method of claim 14, wherein the control signal comprises a first control signal, wherein the bitlines are coupled to a source through storage cells, and further comprising generating a second control signal to couple the source to a high voltage reference (VCC) of the external regulator.

17. The method of claim 16, wherein the bitlines are coupled to the source until connecting the bitlines to the internal regulator.

18. The method of claim 14, wherein connecting the bitlines to the internal regulator comprises connecting selected bitlines to a ground reference of the internal regulator and connecting inhibited bitlines to a VCC of the internal regulator.

* * * * *